United States Patent
Kelkar et al.

[11] Patent Number: 5,828,255
[45] Date of Patent: Oct. 27, 1998

[54] PHASE LOCKED LOOP HAVING ADAPTIVE JITTER REDUCTION

[75] Inventors: Ram Kelkar, South Burlington; Ilya Iosiphovich Novof, Essex Junction; Stephen Dale Wyatt, Jericho, all of Vt.

[73] Assignee: International Business Machines Corporation, Armonk, N.Y.

[21] Appl. No.: 749,871

[22] Filed: Nov. 15, 1996

[51] Int. Cl.⁶ .................................................. H03L 7/06
[52] U.S. Cl. ............................. 327/157; 327/156; 331/17
[58] Field of Search .................................. 327/147, 148, 327/150, 156, 157, 159, 553; 331/1 A, 11, 17; 375/374–376

[56] References Cited

U.S. PATENT DOCUMENTS

| | | | |
|---|---|---|---|
| 5,095,288 | 3/1992 | Dent | 331/17 |
| 5,128,968 | 7/1992 | Yoshida | 375/97 |
| 5,173,664 | 12/1992 | Petersen et al. | 331/1 A |
| 5,233,314 | 8/1993 | McDermott et al. | 331/17 |
| 5,309,428 | 5/1994 | Copley et al. | 370/17 |
| 5,319,320 | 6/1994 | Abe et al. | 331/1 A |
| 5,332,930 | 7/1994 | Volk | 307/270 |
| 5,491,439 | 2/1996 | Kelkar et al. | 327/157 |
| 5,630,113 | 5/1997 | Hayssen, III et al. | 395/558 |

OTHER PUBLICATIONS

IBM Technical Discloure Bulletin vol. 34 No. 4B Sep. 1991 pp. 468–473 Author: R. Coburn et al. "Analog PLL With Quick Phase Lock".

*Primary Examiner*—Timothy P. Callahan
*Assistant Examiner*—T. T. Lam
*Attorney, Agent, or Firm*—Floyd A. Anderson

[57] ABSTRACT

Jitter is controlled in a phase locked loop (PLL) adaptively and continuously in real time by a jitter control circuit. The jitter control circuit makes periodic PLL output jitter measurements and causes sequential measurements to be compared. The comparison provides an indication as to whether output jitter is being improved or degraded. Charge pump gains associated with internal parameters and external parameters that adversely affect output jitter are modified in response to the comparisons. If output jitter is adversely affected by an increment or decrement of one of the gain values, then the gain value is moved in the opposite direction. Output jitter is optimized for both gain values. Such optimization occurs during normal circuit operation and is continuous so as to adapt to changing conditions.

17 Claims, 6 Drawing Sheets

PHASE LOCKED LOOP HAVING ADAPTIVE JITTER REDUCTION

FIELD OF THE INVENTION

The present invention relates generally to phase locked loop circuits, and more particularly, to a phase locked loop circuit having improved jitter control based upon an adaptive jitter reduction circuit.

BACKGROUND OF THE INVENTION

In the design and manufacture of Application Specific Integrated Circuits (ASICs) and microprocessor chips it is conventional practice to provide the chip designer with a library of conventional circuits from which to chose and generate the design. The chip designer chooses from this library the necessary circuits and connects them to form the desired chip configuration. In the case of microprocessors the designs and parameters of the library circuits are fixed thus imposing certain constraints on the chip designer. In the case of ASIC chips, not only are the designs fixed but so also are the rules of wiring, thereby imposing additional constraints. Thus the designer is constrained by the circuit design, and in the case of ASIC chips the rules in using the various circuits.

One of the library circuits which can be used by a chip designer is a phase locked loop circuit. Phase locked loops (PLLs) are widely used in many different applications. They are used to perform two or three different functions. A principal function is to lock or align the output clock of a circuit with the clock input. Another function is to multiply (i.e., increase) or divide (i.e., decrease) the output frequency of a circuit with respect to the input frequency. Another function of a phase locked loop is to provide a clock recovery, i.e., to attenuate the input jitter associated with input signals and recover clock from jittery input data.

In providing a phase locked loop circuit, as with other circuits, it is desirable to provide a circuit that is versatile, i.e. one that can be used in a wide variety of applications and environments. Specifically, one challenge is to provide a phase locked loop which is an analog circuit, that can be used on digital CMOS technology in which a good deal of substrate noise is generated. It is also desirable to provide a PLL that is operational over a broad frequency range. Moreover it is necessary in the design of ASIC chips to compensate for delays induced in the clock distribution trees as well as any delays that might be induced by dividers in the feedback portion of the circuit when frequency is being multiplied, which often occurs when the signal is being received from a relatively low frequency source, such as a card, and is being multiplied for use on a chip.

In addition, it is desirable to reduce jitter in both the high frequency range as well as in the lower frequency ranges. To further complicate matters, a recent design problem that has emerged is the problem associated with reduced power supply voltages at which the chips operate, these voltages being 5 volts, 3 volts, or even as low as 2 volts. At these low power supply voltages conventional charge pumps in many cases are not adequate to maintain the loop on locked condition. Moreover, overriding all of these constraints and conditions is the need to use as little "real estate" i.e., surface area of the chip, as possible for the circuit, which has been and continues to be a major consideration in the design of the PLLs as well as other circuits.

Hence, not only does the ASIC designer face the challenges of minimizing jitter based upon external parameters (jitter reduction versus bandwidth) and internal parameters (power supply levels, substrate noise, thermal variations), but there is the additional constraint that loop parameters are normally pre-set based on specific applications. An ASIC PLL macro, however, is expected to be used for different applications. The apparent outcome is that different ASIC customers would have to accept a higher jitter associated with an average application. Application specific variables that affect jitter include input jitter, analog voltage supply noise and substrate noise.

Accordingly it is desired to provide a method and apparatus for determining a minimum PLL output jitter regardless of the specific application, including an ability to minimize long-term or cycle-to-cycle jitter based on user preference.

SUMMARY OF THE INVENTION

An object of the present invention is to provide an improved jitter reduction circuit for a phase locked loop.

Another object of the present invention is to provide an improved jitter reduction circuit that adaptively reduces jitter in a phase locked loop circuit.

Still another object of the present invention is to provide a phase locked loop circuit having a jitter reduction circuit that adaptively reduces both internal and external jitter.

According to a first embodiment of the present invention, a method in a semiconductor circuit for real time jitter reduction in a phase locked loop is provided. The phase locked loop uses a first charge pump with a forward charge pump current gain and a second charge pump having a main charge pump current gain associated therewith. The method includes initializing the forward and main charge pump current gains to preselected values and measuring the phase locked loop jitter level at periodic points in time. Next sequential jitter level measurements are compared. The forward charge pump current gain is modified until the phase locked loop jitter level cannot be further reduced by further reduction of the forward charge pump current gain. The phase locked loop jitter level is again measured at consecutive points in time, and the main charge pump current gain is modified until the phase locked loop jitter level is minimized. This process is repeated such that phase locked loop jitter level is continuously being monitored and optimized during normal semiconductor circuit operations.

In another embodiment of the present invention, an integrated circuit has a phase locked loop integrated thereon, wherein the phase locked loop is susceptible to both internal and external parameters. The phase locked loop has a first charge pump with a first gain associated therewith for substantially affecting internal parameter phase locked loop output jitter disturbances. The phase locked loop also has a second charge pump having a second gain associated therewith for substantially affecting external parameter phase locked loop output jitter disturbances. The first and second gains, and hence the output jitter, are controlled by an adaptive jitter control circuit. The adaptive jitter control circuit includes a jitter measurement circuit for making phase locked loop jitter measurements. A timer is coupled to the jitter measurement circuit for enabling the jitter measurement circuit at predetermined time intervals. A plurality of memories are provided and selectively receive jitter measurements from the jitter measurement circuit. Coupled to the plurality of memories is a comparator for comparing sequentially saved jitter measurements in the plurality of memories for determining whether the phase locked loop jitter is improved or degraded over time. A parameter control circuit is coupled to the comparator, wherein the parameter control circuit modifies the first and second gains according to the comparison results for optimizing said phase locked loop jitter and providing the first and second gains to the first and second charge pumps.

The foregoing and other objects, features, and advantages of the invention will be apparent from the following more particular description of a preferred embodiment of the invention, as illustrated in the accompanying drawing.

DETAILED DESCRIPTION

Figure 1:
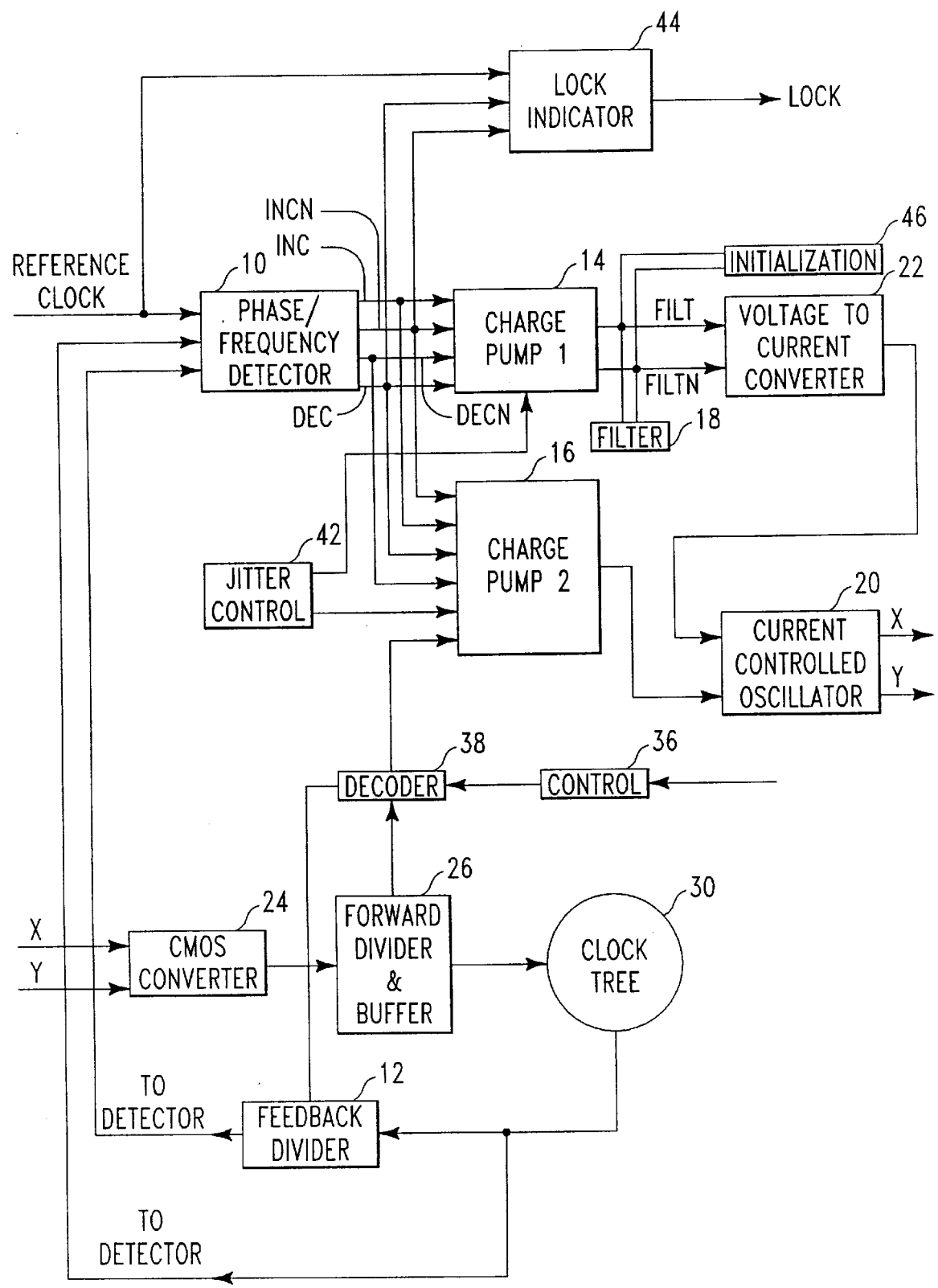
FIG. 1 is a high level block diagram depicting a phase locked loop circuit.

Referring now to the figures, and for the present to FIG.1, a block diagram of a phase locked loop (PLL) circuit according to this invention is shown. Various components and subcircuits of the components will be described in detail presently.

The PLL circuit includes a phase/frequency detector 10 which receives a reference clock input and compares the reference clock input frequency with an output clock signal (clock tree 30). The phase/frequency detector 10 also receives as an input an output strobe pulse of a feedback divider/pulse generator 12 which provides for frequency multiplication in a well-known manner. The strobe pulse is used within the phase/frequency detector 10 to mask the output clock (in a manner to be described) to accomplish frequency division without delay associated with the feedback divider 12 since the phase/frequency detector 10 is comparing a masked feedback signal directly from the clock output and not from the feedback divider/pulse generator 12. Generally the feedback from the clock tree 30, the feedback divider 12 and the reference clock are used to align the output clock (i.e. clock tree 30). The phase/frequency detector 10 will output increment (INC) and decrement (DEC) pulses to charge pumps 14 (forward or auxiliary charge pump) and 16 (main charge pump).

The phase/frequency detector 10 is a rising edge detector. It compares the rising edge of the reference clock signal and the rising edge of the PLL output clock. When an output clock phase falls behind or lags the reference clock phase, increment (INC) pulses are generated. The width of this pulse $t_1$ is equal to the timing difference between the rising edges of the reference clock and output clock. When an output clock phase is ahead of or leads the reference clock phase decrement (DEC) pulses are generated. The width of this DEC $t_2$ pulse equals the timing difference between the rising edges of the output clock and reference clocks. Due to speed limitations of the phase/frequency detector circuits, no INC or DEC signals will be generated when reference clock and output clock phases reach a certain stated delta value. If this delta value is around zero, the detector phase crossing is known as a "dead zone" because the detector is functionally "dead" in this region.

This dead zone causes extra static phase error in the PLL. In order to build a phase/frequency detector without the "dead zone" extra delay is added in the detector state machine. When the output clock falls behind (lags) the reference clock in phase, the INC pulse is generated. The width of this INC pulse consists of two portions $t_1$ and $t_3$. $T_1$ is equal to the timing difference of rising edges of the reference clock and the output clock. $T_3$ is produced by the extra delay in the phase detector state machine. DEC pulses are created too, and their width is equal to $t_3$. As will be described presently, charge pumps will generate current pulses equal in width to INC and DEC pulses. Because INC will add charge to a differential loop filter 18 and DEC will subtract charge from the differential loop filter 18, $t_3$ portion of INC and DEC charges will cancel each other at the loop filter 18. The net charge to the filter will be proportional to $t_1$ only.

Charge pump 14, the forward charge pump, outputs a current signal to the differential loop filter 18, which is comprised of a pair of capacitors, and which charge pump 14 will either increase or decrease the charge on the capacitors within the loop filter 18 depending upon whether the signal is to increment or decrement the frequency. The increment/decrement signal is also supplied to the second charge pump 16, the main charge pump, which converts the increment/decrement signal to a current output which is fed forward to a differential current controlled oscillator 20 which changes its output frequency in response to change in input current. The use of charge pump 16 which supplies current to the oscillator 20 eliminates the need for a resistor coupled to the capacitor of the filter 18. In effect, this performs the differentiation function normally accomplished by such a resistor, as will be described presently in conjunction with the current controlled oscillator 20. Thus, if the output clock is earlier in phase than the reference clock, the phase/frequency detector 10 generates a decrement pulse, and the charge pumps 14, 16 converts this logic signal to current pulses. The pulse from the charge pump 14 decreases the voltage across loop filter capacitors 18. Conversely, if the output clock signal is later in phase than the reference clock, the phase/frequency detector 10 generates an increment pulse that the charge pump 14 uses to increase the voltage across the loop filter capacitors 18. The loop filter capacitors 18 convert the current from the first charge pump 14 to voltage. In essence the loop filter capacitors 18 and the voltage to current converter 22 smooth the pulses from the charge pump 14 in order to provide smooth DC current to current controlled oscillator 20.

The zero needed for loop stability is created by the charge pump 16 which injects current directly into the oscillator 20 after the required gain is applied to the output of the phase/frequency detector 10. The action of a charge pump in creating the zero can best be explained by examining the prior art wherein the filter is comprised of a resistor R in series with a capacitor C. The filter is fed by a charge pump which puts out current pulses $i(\omega)$ where $\omega$ is equal to $2\pi f$, and where f is the frequency. The voltage across the filter $v(\omega)$ is then fed into the voltage-to-current converter which has a gain of g. The output of the voltage-to-current converter $i_1$ is fed into the current controlled oscillator.

$v(\omega)$ is defined by the equation:

$$v(\omega) = i(\omega) \times R + \frac{i(\omega)}{(\omega)c}$$

and $i_1$ is defined by the equation:

$$i_1 = g \times v(\omega) = g \times R \times i(\omega) + g \times \frac{i(\omega)}{(\omega)c}$$

It can be seen then that the first term in the above equation, i.e, g×R×i(ω)=$i_d$ is really the current i(ω) multiplied by a gain factor g×R, while the second term represents the integral of the injected charge. The current fed into the oscillator is thus the sum of two components.

In the present implementation the total injected current is created by summing the two terms in the above equation. Charge pump 16 creates the first term $i_d$ by applying the correct gain to the current, while charge pump 14 implements the capacitive integration through the filter and the voltage-to-current converter 22. The two components of the total current are then summed at the current controlled oscillator 20 input. The key benefits of this resistorless implementation are that no resistor is needed in the loop filter, thus saving space and cost; and also, it is easy to change the gain g×R to accommodate a wide range of input and output clock operating frequencies.

The output voltage from the loop filter 18 is supplied as input to the voltage to current convertor 22 of conventional design wherein the voltage is converted to current as an output in a well-known manner. The output current from the voltage to current converter 22 is supplied to the differential current controlled oscillator 20 along with the output from the charge pump 16. These two inputs are summed by the current controlled oscillator 20 to provide a differential output, the frequency of which depends upon the value of the current outputs of voltage to current converter 22 and the second charge pump 16.

The differential voltage output of the differential current controlled oscillator 20 is supplied to CMOS converter 24 of conventional design which converts the differential voltage output of the current controlled oscillator 20 to a single ended output of the desired frequency. The output of the CMOS converter 24 is supplied to a forward frequency driver and buffer 26 of conventional design, which provides a signal having the desired multiple of the input clock frequency as input to a clock distribution tree 30.

The clock distribution tree 30 is a series of clock circuits designed and utilized by the chip designer to perform various clocking functions that are required. In the case of ASIC chips there may be several chips used, each of which requires the same clock timing signals. Since processing variables may tend to introduce different delays from chip to chip in the clock distribution tree 30, the output from the clock distribution tree rather than the output from the forward divider and buffer 26 is used as the input to the phase/frequency detector 10 so as to provide the proper phase alignment in all of the chips running from the same clock irrespective of different delays in different chips. The output from the clock distribution tree 30 is also used as input to feedback divider and buffer 12 of conventional design, which functions as a frequency multiplier for the output from the phase frequency/detector 10.

In order to control the frequency multiplication ratio as well as control the gain of the charge pump 16 a control circuit 36 is provided which provides signals to a decoder 38. The decoder 38 in a well known manner provides signals to charge pump 16 and dividers 26 and 12 to set the frequency multiplication ratios of the circuit.

A jitter control circuit 42 is also provided, which will be described in detail presently, and which provides the desired control signals to the charge pumps 14, 16 to adaptively reduce jitter in a manner according to a preferred embodiment of the present invention. The lock indicator 44 receives input from the phase/frequency detector 10 and the clock reference signal and outputs a "locked" signal. Finally an initialization circuit 46 is provided which will initialize the circuit in a stable range for proper phase locking by supplying a proper charge to the loop filter capacitor 18 in a well-known manner.

Electrical inputs are provided to the various circuits which are well known in the art and not shown in FIG. 1. Certain of these will be referred to in describing the circuits of various components.

Initialization

Figure 2:
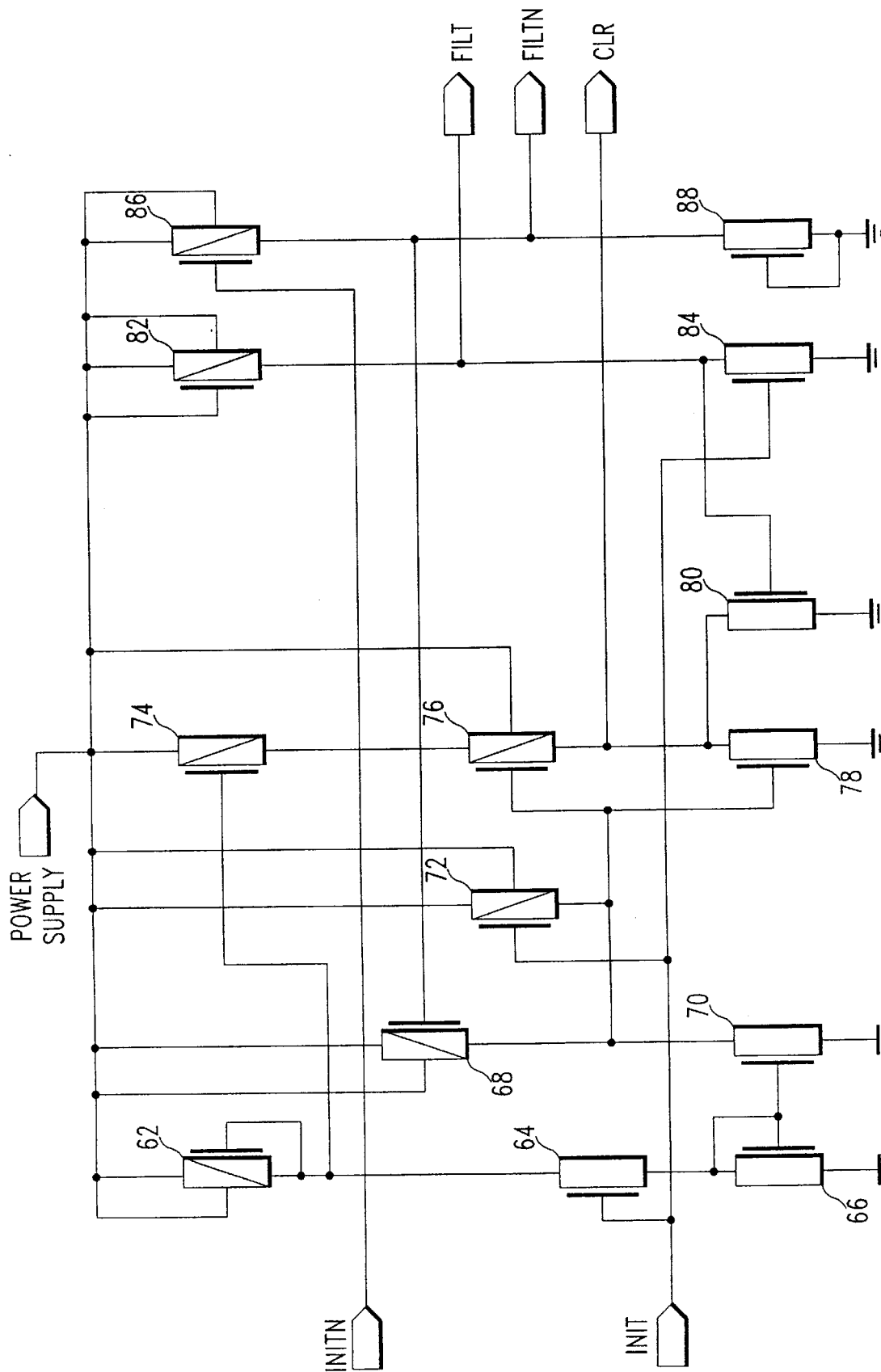
FIG. 2 is a circuit diagram of an initialization circuit of the phase locked loop circuit of FIG. 1.

Referring now to FIG. 2, at power up, inputs INIT and INITN are forced high and low, respectively, by a latch that is set when power is applied. These turn on FET devices 84 and 86 to pull FILTN high and FILT low forcing the current controlled oscillator 20 to its lowest operating frequency. INIT high also activates FET's 62–80, which sense the FILT/FILTN voltages and hold CLR low until FILT is near ground and FILTN is near power supply voltage. CLR then rises, resetting the latch in INITA and turning off the initialization devices. FET's 82 and 88 are permanently off, but match the capacitance added to FILT and FILTN by FET's 84 and 86. Such initialization circuits are well known in the art.

Phase/Frequency Detector and Divider

The phase/frequency detector 10 is configured to receive an output signal from the clock tree 30 and also from the feedback divider 12 for detecting the phase difference with respect to the reference clock, and output the necessary increment and decrement signals. Both signals (clock tree 30 output and feedback divider 12 output) are used since the output frequency is a multiple of the input frequency, and the feedback divider, while outputting a signal matching the frequency of the input signal introduces a delay; hence, the phase of the output of the feedback divider 12 lags the phase of the output signal from the clock tree 30. The phase/frequency detector 10 includes circuitry which masks the output signals from the clock tree so as to have the unmasked rising or falling edges of this pulse match the frequency of the rising or falling edges of reference clock input.

Jitter Control

One of the characteristics of the environment in which the phase locked loop operates is known as jitter which is a result of slight inherent variations in the frequency of the input clock pulses. This results in a noise condition which if not corrected or compensated for shows up on the output signal from the current controlled oscillator 20, especially in the lower frequency ranges. At low frequencies this gain is unity, and thus all input jitter is fed through the PLL as output noise. The frequency at which the gain starts declining can be adjusted somewhat, e.g., between F1 and F2 by controlling values of various components, but even so the low frequencies will still be throughput unity. The jitter control circuit 42 reduces the output jitter or noise, even at low frequencies, when the PLL is in the locked or operating condition.

The jitter control circuit 42 operates on the principal that during the locking phase of the PLL, i.e. when the circuit is not locked but is generating incrementing and decrementing pulses, a relatively large current is supplied from the reference current generator in order to allow the PLL to become locked; but when the PLL is in the locked condition a much smaller average current is supplied in order to maintain the PLL in the locked condition. The amount of jitter on the output depends upon the output current of the charge pumps 14, 16, and a reduction in current supplied to the charge pumps will result in reduction of the charge pump output, which in turn reduces the output noise due to jitter.

Figure 3:
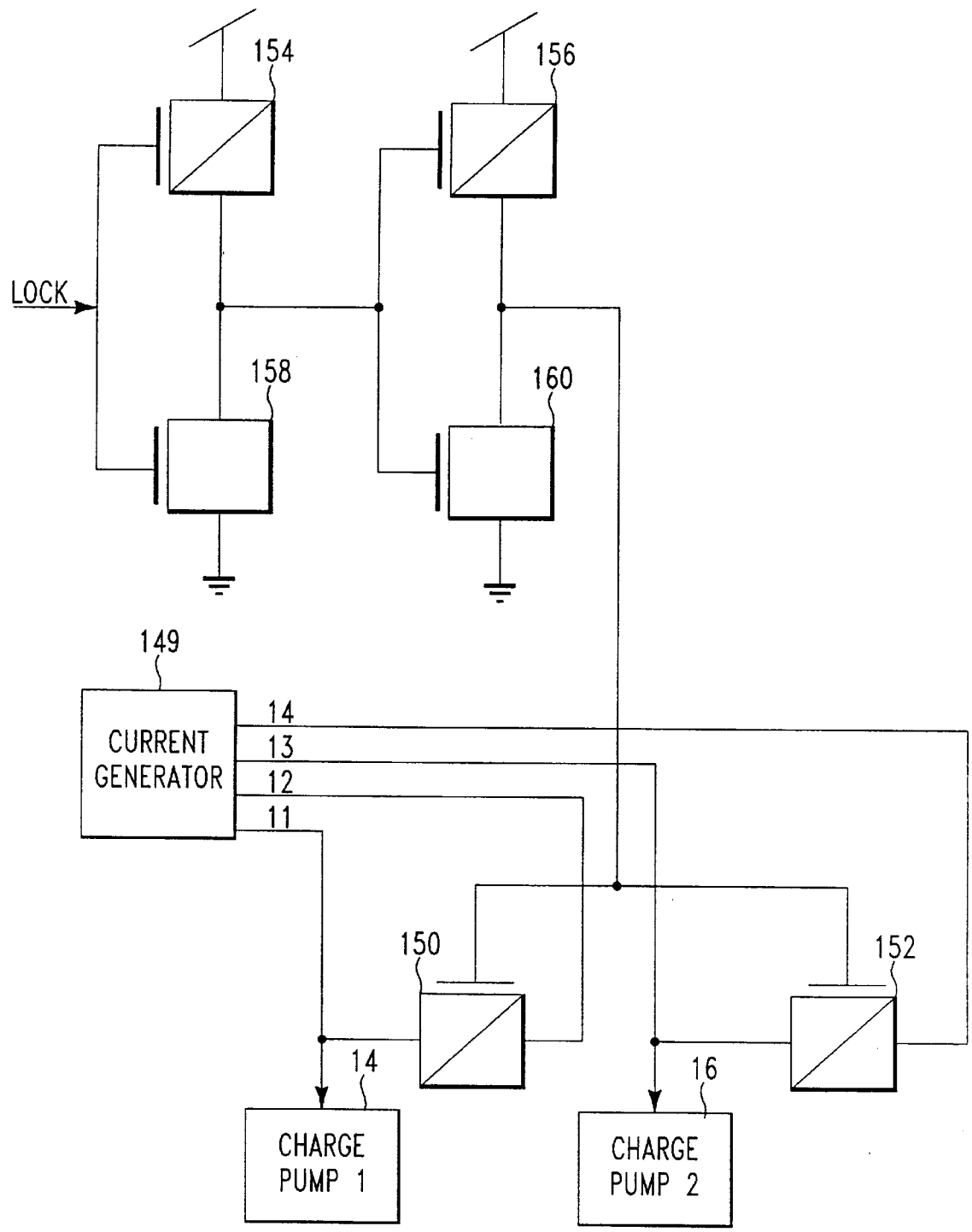
FIG. 3 is a circuit diagram of the jitter control circuit of the phase locked loop.

The circuit for controlling the current to the charge pumps is shown in FIG. 3. This circuit utilizes four current inputs from current generator 149 designated as I1, I2, I3 and I4. Current I1 is supplied directly to charge pump 14 and I3 is supplied directly to charge pump 16. Current I2 is supplied through Field Effect Transistor (FET) 150 to charge pump 14, and current I4 is supplied through FET 152 to charge pump 16. Thus, if FET's 150 and 152 are turned on the total current supplied to charge pump 16 will be I1 plus I2 and the total current supplied to charge pump 16 will be I3 plus I4. Conversely, if FET's 150 and 152 are turned off the current supplied to charge pump 14 will be I1 and the current supplied to charge pump 16 will be I3. Hence during the locking phase of the PLL when it is adjusting the frequency to arrive at the locked condition the FET's 150, and 152 are turned on, but when the PLL reaches the locked or operating condition the FET's 150 and 152, are turned off thus reducing the current supplied to the charge pumps 14 and 16. This reduced current results in a reduction of the noise in the output signal.

As illustrated in FIG. 3, the FET's 150 and 152 are turned on and off responsive to the output signal from the lock indicator 44. This signal is applied to FET's 154, 156, 158, and 160. FET's 154 and 156 are PFET's and FET's 158 and 160 are NFET's. When the signal from the lock indicator indicates the PLL is in the unlocked condition the FET's 154, 156, 158 and 160 will turn on the FET's 150 and 152 thus enabling supply currents I2 and I4. When the signal from the lock indicator indicates a locked or operating condition the FET's 154, 156, 158, and 160 will turn off the FETS 150 and 152. Alternatively, the signal from the phase/frequency detector 10 could be used in conjunction with required circuitry to turn the FET's 150, and 152 on and off as shown in FIG. 1.

Jitter control 42 (see FIG. 1) provides adaptive jitter control according to a preferred embodiment of the present invention. In standard phase locked loop designs, the loop parameters are pre-set based on simulation models and measurements to minimize jitter for specific applications. In ASICs, however, the same PLL design is re-used by several customers having differing applications. Hence, the ASIC PLL is not tuned for each application, rather the PLL is designed for the average application, and customers must generally accept a higher average jitter. Application specific variables affecting output jitter include input jitter, analog supply noise and substrate noise. The adaptive circuit described herein continuously measures PLL jitter and adjusts the PLL loop parameters to achieve improved jitter performance for each application. This is accomplished by measuring a peak-to-peak output cycle-to-cycle jitter or input-to-output jitter and adjust the PLL loop parameters to minimize either. The measurements and adjustments are performed during normal PLL operation, therefore ensuring jitter minimization for a specific PLL application, and during the time that is most critical.

Figure 4:
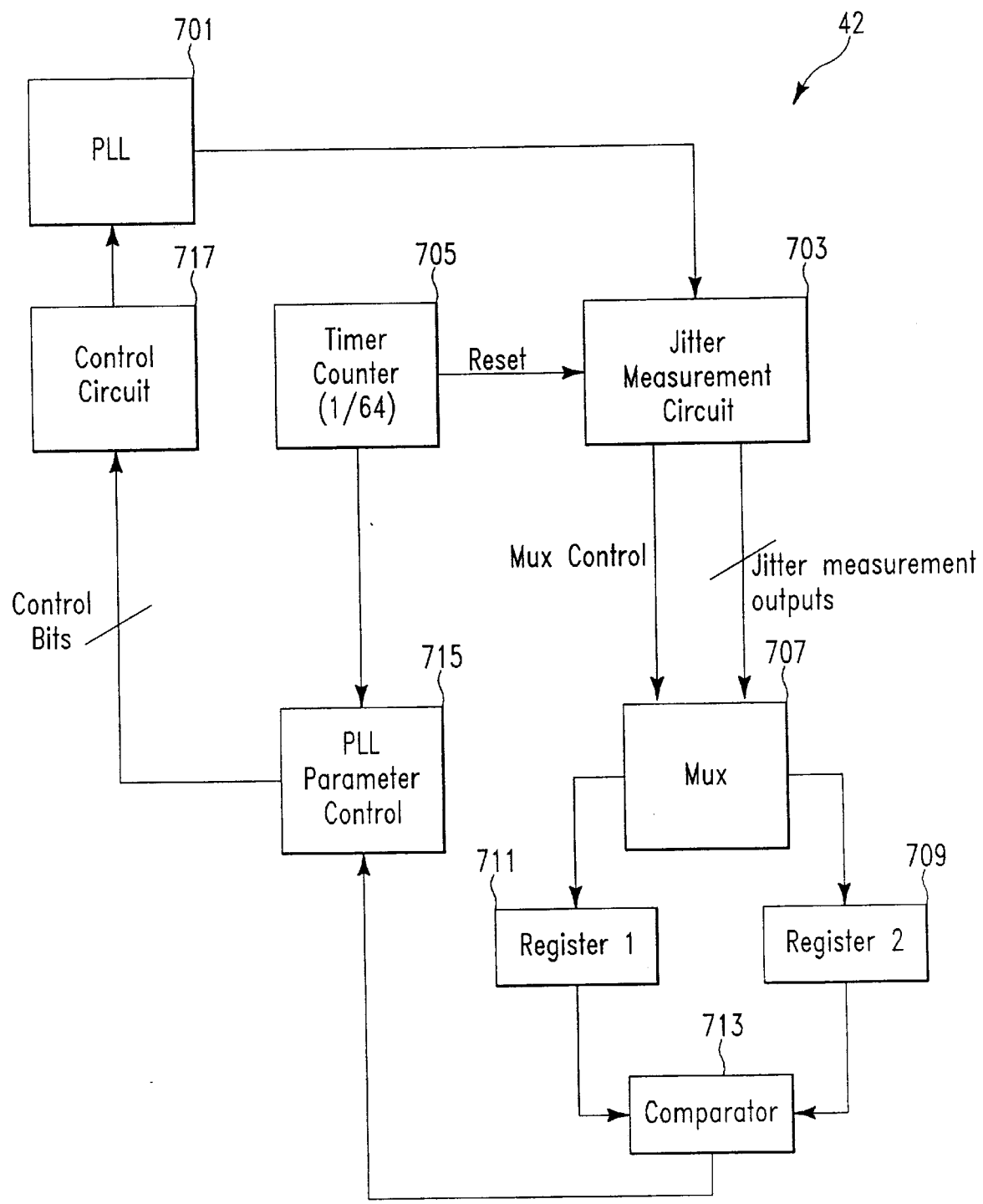
FIG. 4 is a block diagram of the adaptive jitter control circuit according to a preferred embodiment of the present invention.

Referring now to FIG. 4, a block diagram of the adaptive jitter reduction circuit is shown. The PLL 701 is coupled to and jitter is minimized by the jitter control 42, wherein the jitter control 42 includes a jitter measurement circuit 703, a multiplexor 707, a timer counter 705, a multiplexor 707, registers 709 and 711, comparator 713, a PLL parameter control 715, and control circuit 717. The jitter measurement circuit 703 is connected to the PLL 701 via the clock tree 30 outputs for measuring the jitter in real time as previously described. The jitter measurement is digitally provided in thermometer code format to the multiplexor inputs as is well known in the art. The jitter measurement is alternately provided to the registers 709, 711 through the multiplexor 707. The registers 709, 711 store the consecutive jitter measurements until replaced by subsequent jitter measurements. While registers are shown for storing jitter measurements, other memory type of structures may be used as an alternative storage. The timer counter 705 resets the jitter measurement circuit 703 at predetermined time intervals, for example, every sixty-four clock pulses. This reset also causes the multiplexor output to switch from the currently selected output to the other output. Alternatively, the timer counter 705 could directly select the multiplexor 707 outputs.

Regularly switching the present jitter measurement between register 709 and register 711 provides two consecutive jitter measurements for comparison. The contents of registers 709 and 711 are input into the comparator 713. The comparator 713 digitally compares the relative magnitudes of the contents of registers 709 and 711 and provides to the PLL parameter control 715 an equality, greater than or lesser than indication. The PLL parameter control 715 then changes the PLL 701 loop parameters to achieve minimum jitter via a control circuit 717, similar for example to the circuit depicted in FIG. 3. That is, the main charge pump current and forward or auxiliary charge pump current can be modified to control jitter (see FIG. 1).

Figure 5:
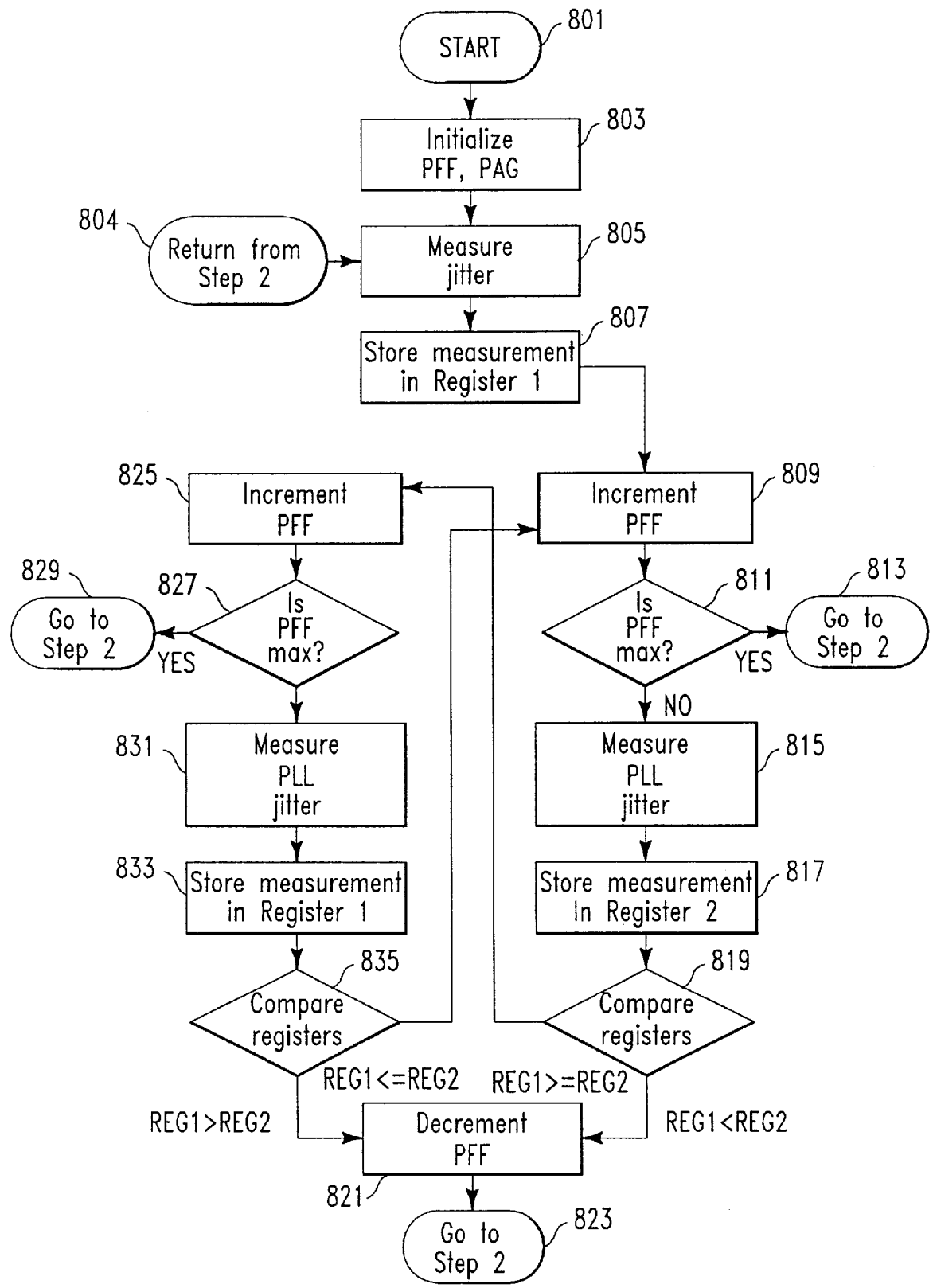
FIGS. 5 and 6 are a flow diagrams depicting a method for adaptive jitter control according to a preferred embodiment of the present invention.

FIG. 5 is a first flowchart of a PLL parameter control circuit method. This control method starts at step 801 with the PLL being initialized at step 803. Here, the PLL parameter control circuit 715 (see FIG. 4) provides initial gain values PFF (forward charge pump current—charge pump 16) and PAG (main charge pump current 14). The PFF and PAG gain values are predetermined values that are selected based on the PLL's forward and feedback dividers to ensure PLL stability. The number of bits used to represent the PFF and PAG gains depends upon the desired resolution. In the preferred embodiment of the present invention, seven different values are available for the PFF and PAG gains and thus only three bits are needed to represent each. More bits can be used to accommodate finer resolution or wider ranges of values.

The registers 709, 711 are reset at step 805 to a known value, for example, all zeros. Also at step 805 the PLL output jitter is measured by the jitter measurement circuit 703. After a predetermined delay, i.e., sixty-four clock cycles as measured by the timer counter 705, the PLL output jitter is stored in register 711, for example, via selecting the proper multiplexor 707 output. Register 711 is selected as receiving the first PLL output measurement for convenience. Either register 709 or 711 could be selected so long as the register selection thereafter alternates. Step 809 includes incrementing the PFF gain in the PLL parameter control circuit 715 and step 811 determines whether the PFF gain is at a maximum value. If the PFF gain is already maximized, then the control method will attempt to tweak PLL jitter by adjusting the PAG gain via step 813. Otherwise, step 811 directs control to step 815.

Following a second jitter measurement period, as controlled by the timer/counter 705, the output PLL jitter is again measured at step 815. This second measurement is now stored in register 709 through multiplexor 707 in step 817. Presently, register 711 stores the first output jitter measurement and register 709 stores the second output jitter measurement. Step 819 makes a comparison of the contents of register 711 (REG1) to the contents of register 709 (REG2) to provide an indication as to whether the output jitter is increasing, or decreasing or unchanged. If the output jitter has decreased or remained the same, then step 819 passes control to step 825 where the PFF gain is again incremented (the prior increment was a change in the proper direction for positively affecting jitter). Equality of consecutive jitter measurements does not indicate that the increase in PFF gain was more proper than a decrease and either an increment, decrement or no change could be selected. If an increase in jitter between consecutive jitter measurements occurs, then step 819 passes control to step 821 where the PFF gain is decremented back to its previous state. After performing step 821, control goes to step 823 for effecting a change in the PAG gain.

After incrementing the PFF gain at step 825, another test is performed at step 827 to determine whether the PFF gain is at its maximum value. If PFF gain is maximized, then control is given to step 829 to adjust PAG gain. Otherwise the output jitter is once again measured at step 831 after the predetermined delay. The latest output jitter measurement is stored in register 711 at step 833 replacing the original output jitter measurement. At step 835 the contents of the registers 711 and 709 are again compared as in step 819. If the jitter was positively affected by increasing the PFF gain further, than step 809 and the process for tweaking PFF gain is repeated. If the jitter was adversely affected by the additional increase in the PFF gain, then step 821 is performed for decreasing PFF back to its prior value before continuing on to optimize the PAG gain.

Figure 6:
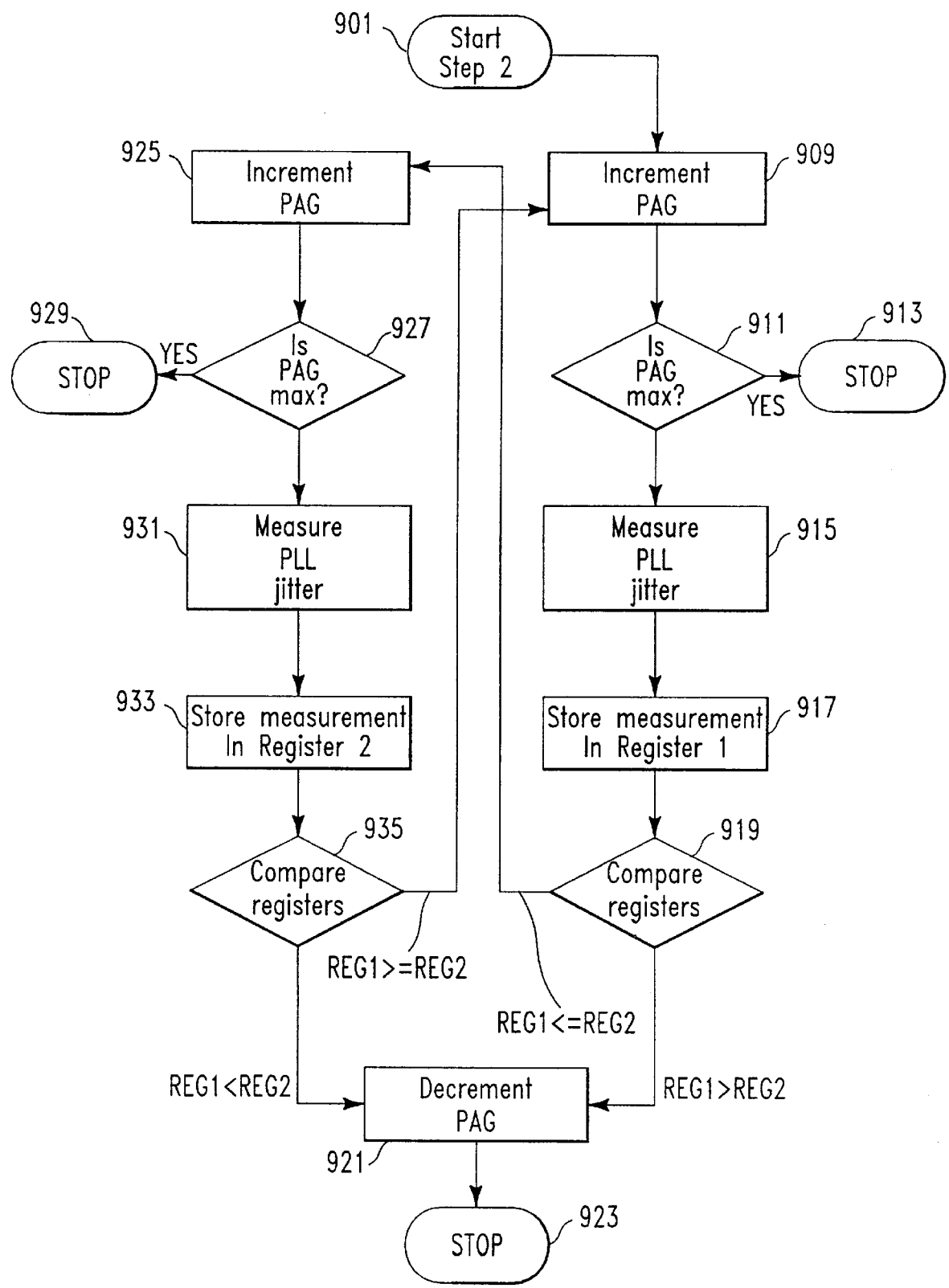

Referring now to FIG. 6, the process for optimizing output jitter by adjusting the PAG gain is shown. Note that steps 909 through 935 are equivalent to steps 809 through 835 as shown in FIG. 5 and described, with the exception that the PAG gain, and not the PFF gain, is being adjusted. After completing steps 909 through 935 (or some subset depending upon the compare results) the jitter is optimized. The process of steps 809 through 835 and 909 through 935 are repeated after resetting the contents of the registers 709 and 711. In this manner, the jitter is constantly being optimized in real time.

While the invention has been particularly shown and described with reference to preferred embodiments thereof, it will be understood by those skilled in the art that various changes in form and details may be made therein without departing from the spirit and scope of the invention. Jitter optimization can be based upon either cycle-to-cycle jitter measurements or input-to-output jitter measurements. Additionally, the choice to first optimize PFF gain is a design choice, and the PAG gain could be optimized first as an alterative. Nor is the invention meant to be limited by the choice of selecting equality to be treated the same as a greater than or less than result. Such equality could cause control to go directly to the alternate gain as those chosen for optimization. Changes in future embodiments of the invention can therefore be made without departing from the teachings herein.

What is claimed is:

1. In a semiconductor circuit, a method of real time jitter reduction in a phase locked loop having a first charge pump with a first gain associated therewith and having a second charge pump with a second gain associated therewith, said method comprising the steps of:

(a) initializing said first and second gains to preselected values;

(b) measuring the phase locked loop jitter level at different points in time;

(c) comparing consecutive jitter level measurements;

(d) modifying the first gain until the phase locked loop jitter level cannot be further reduced by additional changes in the first gain;

(e) re-measuring the phase locked loop jitter level at different points in time;

(f) modifying the second gain until the phase locked loop jitter level cannot be further reduced by additional changes in the second gain; and (g) repeating steps (b) through (f) such that phase locked loop jitter level is continuously being monitored and optimized during normal semiconductor circuit operations.

2. The method according to claim 1 wherein the first gain is a forward charge pump current gain and the second gain is a main charge pump current gain.

3. The method according to claim 1 wherein said first gain is a main charge pump gain and said second gain is a forward charge pump current gain.

4. The method according to claim 1 wherein said phase locked loop jitter measurement is an output jitter measurement provided in thermometer code format.

5. The method according to claim 1 wherein said phase locked loop jitter measurements are made at predetermined intervals.

6. The method according to claim 5 wherein said predetermined intervals are synchronized to a phase locked loop clock.

7. The method according to claim 1 wherein the first gain substantially affects external jitter and the second gain substantially affects internal jitter.

8. In a semiconductor circuit, a method of minimizing external and internal jitter in a phase locked loop during normal operation of the semiconductor circuit, said phase locked loop having a first charge pump with a first gain associated therewith and having a second charge pump with a second gain associated therewith, said method comprising the steps of:

(a) initializing said first and second gains to first and second gain values;

(b) measuring a first output jitter of said phase locked loop and storing said first output jitter in a first storage circuit;

(c) modifying said first gain value;

(d) measuring a second output jitter of said phase locked loop and storing said second output jitter in a second storage circuit;

(e) comparing said first and second output jitter measurements and determining whether modifying said first gain value improved or degraded external jitter associated with said phase locked loop jitter;

(f) repeating the measuring, comparing and modifying steps until the phase locked loop output jitter is optimized or the first gain value has reached a maximum value; and (g) repeating steps (b) through (f) for modifying said second gain value to an optimum level for reducing output jitter associated with the phase locked loop, thus optimizing output jitter in real time.

9. The method according to claim 8 wherein the first gain is a forward charge pump current gain and the second gain is a main charge pump current gain.

10. The method according to claim 8 wherein the first gain is a main charge pump current gain and the second gain is a forward charge pump current gain.

11. The method according to claim 8 wherein said phase locked loop jitter measurement is an output jitter measurement provided in thermometer code format.

12. The method according to claim 8 wherein step (g) further includes resetting the contents of the first and second storage circuits to known values.

13. The method according to claim 8 wherein the measuring step (b) and re-measuring step (d) are made at predetermined time intervals as measured by a phase locked loop clock.

14. The method according to claim 8 wherein said steps (b) through (g) are continuously repeated during normal semiconductor circuit operation for maintaining an optimal phase locked loop output jitter throughout such operation.

15. An integrated circuit having a phase locked loop integrated thereon, said phase locked loop susceptible to both internal and external parameters adversely affecting output jitter, said phase locked loop having a first charge pump with a first gain associated therewith, said first charge pump substantially affecting internal parameter phase locked loop output jitter disturbances, said phase locked loop having a second charge pump, said second charge pump substantially affecting external parameter phase locked loop output jitter disturbances, said first and second gains, and hence said output jitter, controlled by an adaptive jitter control circuit, said adaptive jitter control circuit comprising:

a jitter measurement circuit for making phase locked loop jitter measurements;

a timer coupled to said jitter measurement circuit for enabling the jitter measurement circuit at predetermined time intervals;

a plurality of memories for selectively receiving jitter measurements from said jitter measurement circuit;

a comaparator coupled to said plurality of memories for comparing sequentially saved jitter measurements in said plurality of memories for determining whether the phase locked loop jitter is improved or degraded over time; and a parameter control circuit coupled to said comparator, said parameter control circuit modifying said first gain and said second gain according to comparator results for optimizing said phase locked loop jitter and providing said first and second gains to said phase locked loop.

16. The integrated circuit according to claim 15 wherein the phase locked loop jitter measurements are cycle-to-cycle jitter measurements.

17. The integrated circuit according to claim 15 wherein the phase locked loop jitter measurements are input-to-output jitter measurements.

* * * * *